United States Patent [19]

Hilton

[11] Patent Number: 5,179,293
[45] Date of Patent: Jan. 12, 1993

[54] BIPOLAR OUTPUT STAGE SWITCHING CIRCUIT

[75] Inventor: E. Barry Hilton, Wayland, Mass.

[73] Assignee: Analog Devices, Inc., Norwood, Mass.

[21] Appl. No.: 641,340

[22] Filed: Jan. 15, 1991

Related U.S. Application Data

[63] Continuation of Ser. No. 537,016, Jun. 13, 1990, abandoned, which is a continuation of Ser. No. 276,923, Nov. 28, 1988, abandoned.

[51] Int. Cl.$^5$ .................... H03K 17/16; H03K 17/60; H03K 19/082
[52] U.S. Cl. .................................. 307/255; 307/470; 307/473
[58] Field of Search ............... 307/262, 264, 255, 470, 307/473

[56] References Cited

U.S. PATENT DOCUMENTS

| | | | |
|---|---|---|---|
| 4,029,971 | 6/1977 | Pryor | 307/473 |
| 4,385,394 | 5/1983 | Pace. | |
| 4,594,558 | 6/1986 | Congdon. | |
| 4,623,799 | 11/1986 | Nyman, Jr. | 307/264 |
| 4,800,294 | 1/1989 | Taylor | 307/264 |
| 4,814,638 | 3/1989 | Weick | 307/473 |

OTHER PUBLICATIONS

Patent Abstracts of Japan, vol. 10, No. 108, (E-398) (2165), 23 Apr. 1986 & JP, A, 60245310 (Nihon Kemikon K.K.) 5 Dec. 1985, "Driving Circuit".

Primary Examiner—John Zazworsky
Attorney, Agent, or Firm—Wolf, Greenfield & Sacks

[57] ABSTRACT

A technique and circuit for switching a bipolar output stage between an active mode in which the stage operates as a voltage source and an inhibit mode in which the stage is deactivated and the output node presents a floating high-impedance. The output stage may be in a digital device such as a digital pin driver circuit, or in an analog amplifier. Considering first the digital application, in the active mode, a digital output is switched between logic high and logic low voltages established by external references. The logic high and logic low reference voltages, and the corresponding output voltages, may be set to zero, a positive voltage or a negative voltage independently of each other; a logic "one" can thus be set to a voltage below a logic "zero". When the output stage is an analog amplifier, in active mode it amplifies its input signal. In either arrangement, in the "inhibit mode", the output stage transistors are turned off by reverse-biasing their base-emitter junctions relative to the output node of the circuit, to provide a floating high-impedance output node. In the inhibit mode, additional means are provided for substantially cancelling leakage current at the output node.

14 Claims, 2 Drawing Sheets

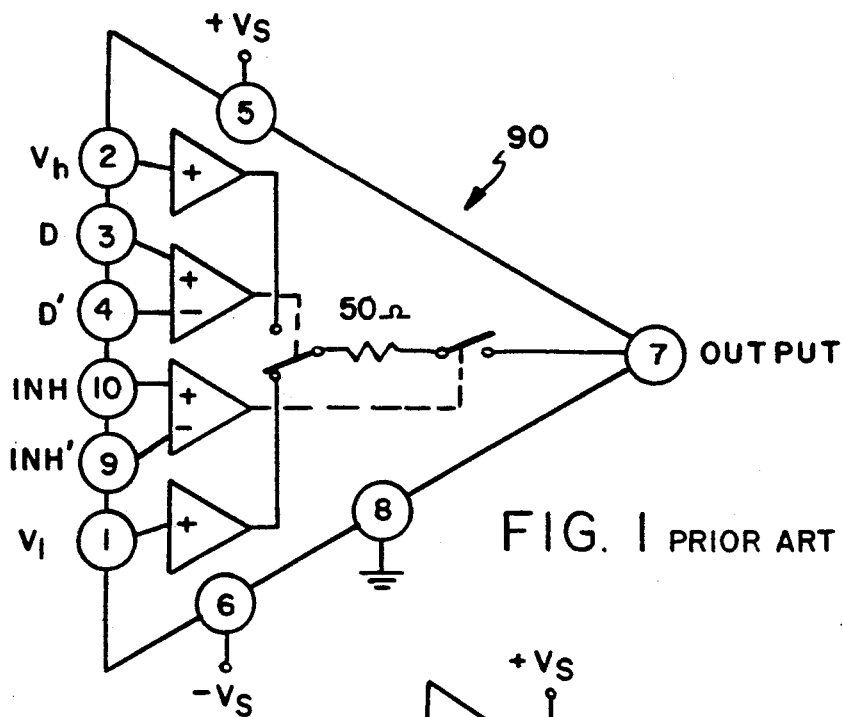
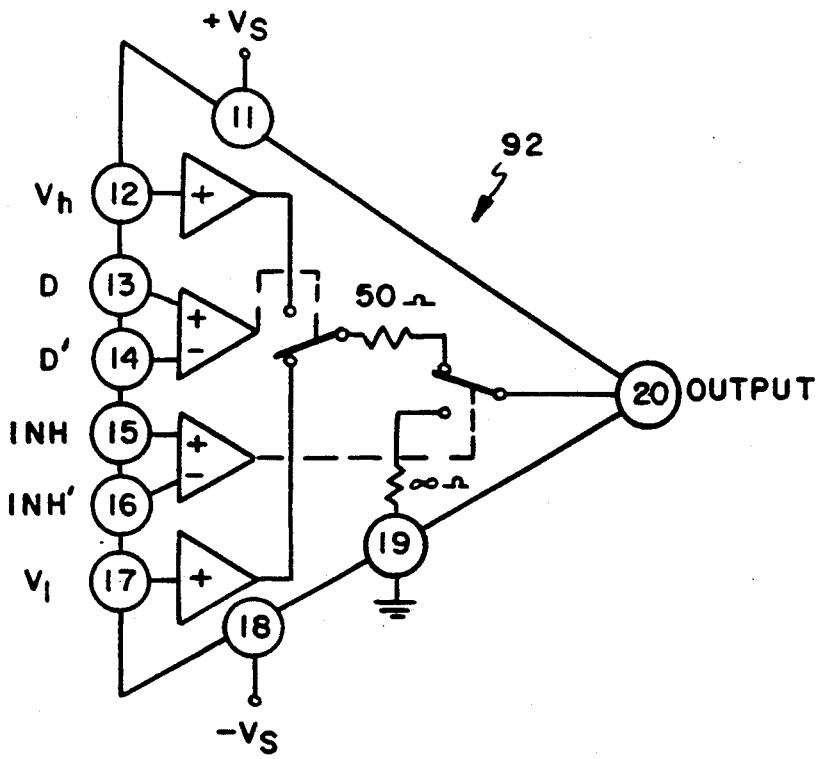
FIG. 2
| D | D' | Q1 | Q2 | Q3 | Q4 | Q21 | Q26 | Q20 | Q25 | Q27 | Q28 |
|---|----|----|----|----|----|-----|-----|-----|-----|-----|-----|
| 0 | 1  | OFF| ON | ON | OFF| OFF | OFF | ON  | ON  | OFF | ON  |
| 1 | 0  | ON | OFF| OFF| ON | ON  | ON  | OFF | OFF | ON  | OFF |
FIG. 4

BIPOLAR OUTPUT STAGE SWITCHING CIRCUIT

This application is a continuation of application Ser. No. 537,016, filed Jun. 13, 1990, now abandoned, which is a continuation of application Ser. No. 07/276,923 filed Nov. 28, 1988, now abandoned.

BACKGROUND OF THE INVENTION

1. Field of the Invention

This invention relates to a bipolar output stage switching circuit and technique, suited for monolithic fabrication and intended particularly for use in automated test equipment to drive an input pin in an integrated circuit device under test (DUT). For digital use, the output of the circuit can be switched to a logic high signal, a logic low signal, or to a high impedance. The circuit is also adaptable to analog use and may be employed, for example, in the output circuit of an operational amplifier to provide a mode in which the amplifier ceases to act as a voltage source and instead provides a floating high impedance output.

2. Discussion of Prior Art

In testing digital integrated circuitry, a pin driver circuit is used to supply to the DUT the binary ones and zeroes needed to exercise the DUT. Thus, at a minimum, a pin driver circuit must be capable of providing logic high and low signals, corresponding to binary ones and zeroes, respectively, at its output. However, since some integrated circuits are intended to supply "read" data to the same pins to which "write" data is provided, on an alternating basis, it is necessary also to disconnect the pin driver circuit during read operations. Mechanically disconnecting the pin driver circuit while connecting a receiver circuit is a time consuming operation which slows down the testing process. It is advantageous, therefore, to be able to disable and disconnect the pin driver electrically from the DUT, without mechanically disconnecting it, allowing the pin driver output and the receiver circuit input to be in simultaneous electrical contact with the DUT. To this end, some pin drivers provide a mode in which the output of the circuit ceases to be a voltage source and instead becomes a high impedance which will not "load down" the output of the DUT. This capability facilitates reading from the DUT without disconnecting the pin driver, and is available in such advanced pin drivers as the AD345 pin driver from Analog Devices, Inc., Norwood, MS, U.S.A. In the AD345 pin driver, for example, the output stage is a pair of complementary emitter followers and a mode of operation is available in which a high impedance condition at the output is provided by reverse-biasing the bases of the output stage transistors to opposite supply voltages. This mode of operation is termed the "inhibit" mode. Operation in this mode, of course, disables and inhibits ordinary binary output switching operation.

Prior art pin drivers have been good, but leave room for improvement. For example, in the prior art, the delay time encountered in going into and out of the inhibit mode is not independent of the initial conditions. That is, it may take a substantially different amount of time to go between a logical high output (i.e., a digital "one") and a floating high impedance than it takes to go between a logic low output (i.e., a digital "zero") and a floating high impedance. Thus, the delay time may be quite variable. This variability of delay time interferes with obtaining precise measurements of DUT performance (e.g. time for the DUT to switch states or modes of operation).

Additionally, in prior art pin drivers, the output voltage can overshoot or preshoot the nominal logic levels when going into or out of inhibit mode. Both conditions are undesirable as they can lead to erroneous device or circuit operation. These characteristics are a direct result of reverse-biasing the output stage transistors to opposite supply voltages to create a high impedance output condition.

OBJECTS O THE INVENTION

Accordingly, it is an object of the present invention to provide an improved pin driver circuit.

It is a further object of the invention to provide an improved pin driver circuit capable of creating a high-impedance node at its output.

Yet another object of the invention is to provide an improved pin driver circuit in which the transition time for the output to go from a logic "one" level to a floating impedance is substantially the same as the time required for the output to go from a logic "zero" level to a floating high impedance.

Another object of the invention is to provide an improved pin driver circuit suitable for monolithic fabrication.

Still another object of the present invention is to provide a pin driver circuit suitable for high speed operation, such as in the range of 200 MHz.

Yet another object of the invention is to provide a switching technique and circuit for a bipolar output stage, which can turn off the output transistors and provide a high impedance output node on command.

A still further object is to provide such a switching technique and circuit which are usable in connection with analog amplifier output stages as well as with digital output stages.

Other objects of the invention, and its consequential advantages over the prior art, will become apparent from the following description of the invention and of an embodiment thereof, presented by wa of example only.

SUMMARY OF THE INVENTION

The invention comprises circuitry, and a related technique, for switching a bipolar output stage between an active, output driving mode and an "inhibited", floating high impedance output mode. The output stage may be in a digital device such as a digital pin driver circuit, or in an analog amplifier (e.g., an operational amplifier). Considering first the digital application, in the active mode, a digital output is switched between logic high and logic low voltages established by external references. By contrast, when the output stage is in an analog amplifier, in active mode it amplifies its input signal. In both applications, the output stage transistors are turned off by reverse-biasing their base-emitter junctions relative to the output node of the circuit, providing a high impedance output node. Additionally, current balancing means are provided for substantially canceling leakage current at the output node. This is a valuable ability, as leakage currents could interfere with measurements being made at the DUT.

In general, the invention is applicable to complementary bipolar output stages, though it is not s limited.

Further features and details of the operation of the circuit will become more readily apparent upo review of the detailed description of an exemplary embodiment as set forth below, which description should be read in conjunction with the accompanying drawing.

BRIEF DESCRIPTION OF THE DRAWING

In the drawing:

FIG. 1 is a block diaqram of an exemplary prior art digital pin driver;

FIG. 2 is a block diaqram of a bipolar output stage switching circuit according to the present invention, for use in a digital pin driver;

FIG. 4 is a chart showing the conditions of certain transistors in the circuit of FIG. 3 as a function of the inputs.

DETAILED DESCRIPTION

Figure 3:
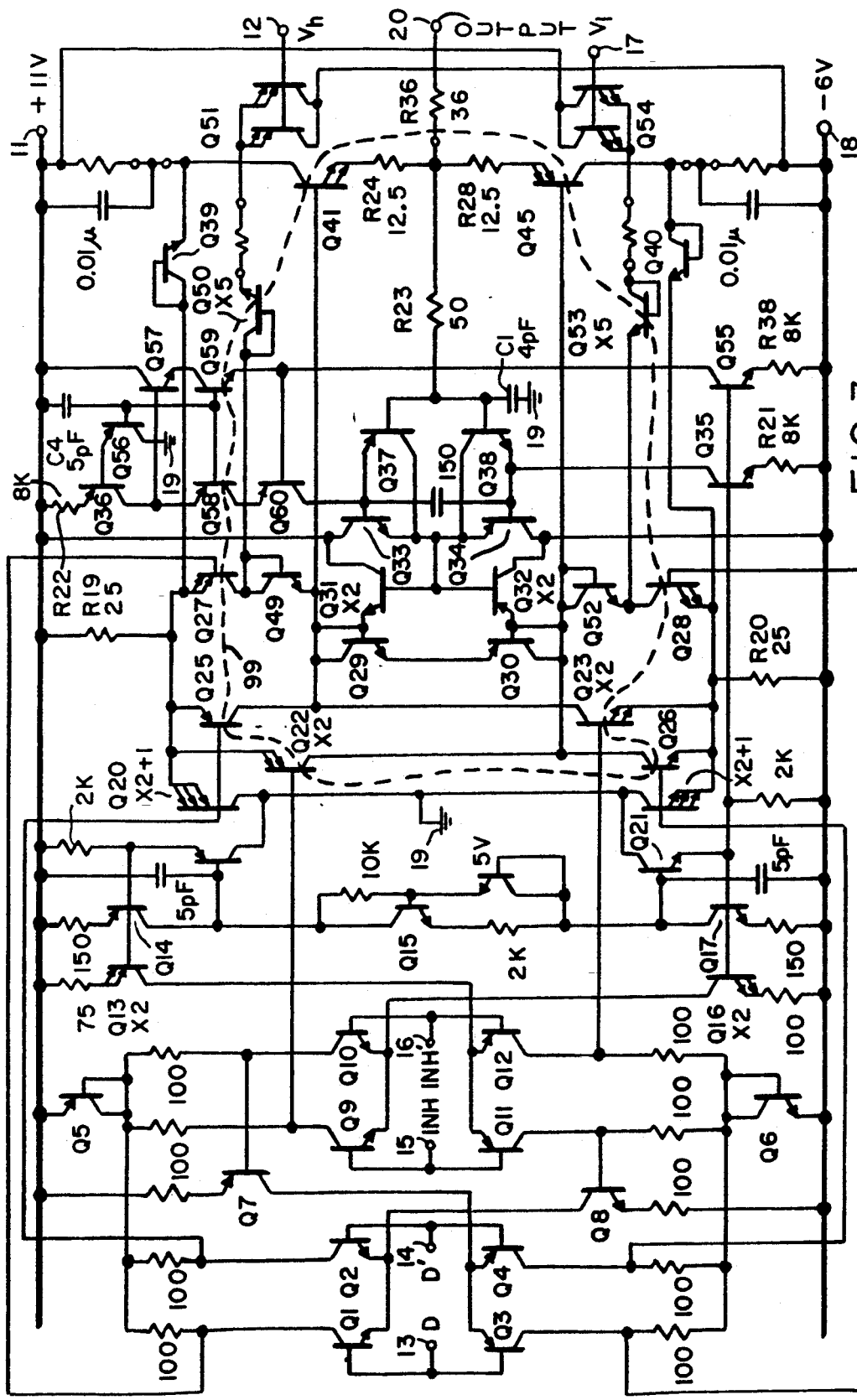
FIG. 3 is a schematic circuit diaqram of an embodiment of the present invention.

The invention will be better understood if it is first placed in proper context against the prior art. For purposes of discussion, the invention will be considered in the context of a digital pin driver circuit for use in automated test equipment. Those skilled in the art will appreciate that this context is not limiting. The same output circuitry (i.e. complementary emitter followers) is commonly used in analog output circuits, also.

A block diagram of a typical prior art digital pin driver circuit 90, the Analog Devices AD345, is shown in FIG. 1. In use, the output of this pin driver circuit is applied to a DUT, such as a digital logic circuit. A logic signal and its complement, for application to the DUT, are applied, at the D, or non-inverting, input 3 and at the D, or inverting, input 4. The logic high and low signals will appear at the output of the pin driver in the form of voltages equal to the reference voltages which are applied to the input terminals 2 and 1, labelled $V_h$ and $V_l$, respectively. These voltages may be selected to be the characteristic values of any logic family. Hence, the pin driver may be used to exercise a device from any logic family.

This circuit further needs a positive supply voltage, which is applied at terminal 5, and a negative supply voltage, which is applied at terminal 6. The circuit is connected to a ground at terminal 8 and output for driving a pin of the DUT is provided at output terminal 7.

Such prior art pin drivers are operable in two modes, termed the "active" mode and the "inhibit" mode. In the active mode, high and low logic signals applied to the D and D' inputs of the driver appear (after a propagation delay) at the output terminal 7, with the output levels equal tot eh preselected voltages $V_h$ and $V_l$. In the inhibit mode, the driving circuitry is disabled and inhibited by reverse-biasing the bases of the output stage transistors to opposite supply voltages. This reverse-biases two Schottky diodes which are in series with the emitters of the output stage transistors, leaving the output connected only to the high impedance of a pair of reverse-biased diodes. Leakage currents can be significant, degrading performance margins (considered in light of the high impedance which may be present).

By contrast, reference is now made to FIG. 2, showing a block diagram of the present invention. The block diagram reveals that the present invention 92 is superficially similar to the prior art AD345 pin driver. For example, it has the same input and output connections. The present invention is also operable int eh same active and inhibit modes. The characteristics of the circuits in those two modes, however, and the switching between modes, differ markedly between the AD345 pin driver and the present invention. Those differences will be discussed below.

In FIG. 2, it is seen that the output of the driver will logically follow the value on the D input so long as the INH input 15 is low and, of course, the INH' input 16 is high, as the INH and INH' inputs are presumed to be driven by complementary signals. In this fashion, the circuit is used to "drive" data into the DUT. When a high is applied to the INH input, however, ordinary driving operation of the circuit si disabled or "inhibited". It is this mode that facilitates the measuring of "read" data from the DUT.

ACTIVE MODE

A detailed circuit diagram for an exemplary pin driver of FIG. 2 is shown in FIG. 3. The reader may find i helpful in following the ensuing discussion of the operation of the circuit, to refer also to the chart of FIG. 4, which shows the conditions of selected transistors in FIG. 3 as a function of the input data.

Two pairs of complementary emitter coupled transistor pairs (i.e., transistor pairs Q1 and Q2 and Q3 and Q4) form an input stage to a drive circuit. It is to these transistors that the data desired to be written to the DUT is applied. Consider, for example, a logic high, or "one" being applied to input terminal D and its complementary low, or "zero" being applied to input terminal D'. As indicated in FIG. 4, this input condition switches on transistors Q1 and Q4 and switches off transistors Q2 and Q3. Transistor Q4 allows current through R20. This current splits in a 3:1 ratio through transistors Q21 and Q26, due to the fact that they have a 3:1 emitter ratio, such that three-fourths of the current (e.g., 15 ma) flows through Q21 and one fourth of the current (e.g., 5 ma) flows through Q26. The current through transistor Q26 also flows through series diodes Q29 and Q30. The voltage drop across these diodes biases to an "on" condition output stage transistors Q41 and Q45. Transistor Q27 operates as a switchable current source through which flows the current from the positive supply (e.g., 20 ma) via R19. A group of circuit elements is collected together within a dashed line 99. The voltage on these elements moves up or down together in response to the current supplied via R19. Thus, this group of elements collectively functions in some respects like a conventional circuit node. Accordingly, this group of elements may be considered a quasi-node and will be referred to as such. The current from the positive supply via R19, flowing into the high impedance quassi-node 99 (ignoring the Q59-Q55 connection), causes the voltage of that quassi-node, and thereby the output terminal 20, to rise rapidly. The output voltage will rise until it equals $V_h$. At this time, diode Q50 and transistor Q51 will be conducting.

Any current flowing through transistor Q27 that would make the output rise to a voltage higher than $V_h$ instead will now flow through diode Q50 and through transistor Q51 into the negative voltage supply. Thus, the voltage of the high impedance node, and therefore of the output terminal which it encompasses, is seen to be limited at the value of $V_h$, applied at the base of transistor Q51. The DUT will, for any binary high input to the driver, be driven by an output voltage equal to $V_h$.

Owing to the symmetry of the complementary implementation, circuit operation with a logic low input applied to the D input and a logic high applied to the D input is similar to that described above, with transistors Q2 and Q3 behaving as had transistors Q1 and Q4, and transistors Q20, Q25 and Q28 behaving as had transistors Q21, Q26, and Q27. In similar fashion to that described above, the circuit then makes the logical low output of the device equal to $V_l$.

A number of advantages are attendant to this design. For example, the output levels for logic high and logic low signals (i.e. $V_h$ and $V_l$) may be set independently of each other. Further, V and $V_l$ may be chosen to be very close to one another, and either or both of these levels may approach zero. This permits the thresholds of the DUT to be very accurately determined, permitting manufacturers to better grade their production. Further, the voltage assigned to a logic high may actually be lower than that assigned to a logic low, thereby causing the circuit to act as an inverter. Indeed, with proper assignment of $V_h$ and $V_l$, the circuit can even be used for four-quadrant multiplication. A high bandwidth is available between the $V_h$ and $V_l$ inputs and the outputs, allowing use, for example, as a video switch.

Advantageously, the output impedance of the circuit in active mode is maintained close to 50 ohms, for matching to the characteristic impedance of a coaxial cable and minimizing reflections due to impedance mismatches. The output impedance is given by the series combination of a 36 ohm output resistor R36, 12.5 ohm emitter resistors R28 and R24, and the emitter resistances of transistors Q41 and Q45.

Consider now the conditions existing at the output pin during inhibit mode operation. In particular, consider the impedance condition at the output pin.

At the output stage, there is provided a unity-gain complementary emitter voltage follower, with characteristically high input impedance. This voltage follower is formed by transistor Q33, Q37, Q34 and Q38. Note that transistors Q37 and Q38 are a complementary pair of PNP and NPN transistors, respectively.

Considering the output stage transistor Q41, its reverse-biasing will now be explained. The circuit is symmetrical, so the reverse-biasing of the outer output stage transistor, Q45, is produced in like fashion by the symmetrically corresponding components. Accordingly, only one "side" of the symmetrical circuit will be discussed, to avoid unnecessary repetition.

When the INH inhibit) input at tempal 15 is high and the complementary INH' input at terminal 16 is correspondingly low, transistor Q9 is turned on and it, in turn, turns on transistor Q22. Simultaneously, it will be observed, transistor Q8 is turned off by transistor Q11, tuning off both transistors Q1 and Q2. By this action, transistors Q20, Q25 and Q27 are turned off and all of the current through resistor R19 flows into transistor Q22. The voltage on the collector of Q22 thus rises; as this voltage is applied to th base of diode-connected transistor Q30, the latter element is switched off. (By symmetry, Q29 is also switched off.)

The base emitter of transistor Q30 continue to rise after that transistor is switched off, unit transistor Q32, which is connected as an emitter-follower, is turned on. The two diode-connected transistors Q29 and Q30, which are now off, are the biasing diodes for the output transistors Q41 and Q45. The bias applied to the output transistor sis now supplied via transistors Q31 and Q232, respectively; this is a reverse bias. The bases of emitter-follower transistors Q31 and Q32 are driven by the output of a unity-gain buffer (i.e., a unity-gain complementary-emitter voltage-follower, with characteristically high input impedance) formed by transistors Q37, Q38, Q33 and Q34. The input of this buffer is driven by the output node via resistor R23.

To understand more fully the operation of the buffer not that other is a loop of base-emitter junctions from the emitter of output transistor Q1, via resistors R24 and R23, running back to the base of transistor Q41 via transistors Q37, Q33, and Q31. Since R23 is small, the voltage at the base of transistor Q37 is essentially the same as the voltage at the junction of resistors R23, R24 and R28, which may be called $V_x$. At the emitter of transistor Q37 and base of Q33, the voltage then is $V_x + V_{BE}$, since transistor Q37 is a NP transistor, where $V_{BE}$ is the base-emitter voltage for a forward-biased junction. Since transistor Q33 is of the NPN type, at the emitter of transistor Q33 and base of transistor Q31, the voltage is $V_x + V_{BE} - V_{BE} = V_x$. The voltage at the emitter of transistor Q31 (also NPN) and at the base of transistor Q41 is therefore $V_x - V_{BE}$, which turns off output emitter-follower transistor Q41 by reverse-biasing it approximately two base-emitter voltage drops relative to $V_x$ (or the voltage at output terminal 20).

As $V_x$ floats with the output applied to terminal 20 by the device connector thereto, the bases of the output transistor float relative thereto, always remaining offset from the output by one (and reverse-biased by two) base-emitter voltage drops, until the inhibit circuit is turned of and the system si placed in active drive mode.

In active mode, diode-connected transistor Q29 is turned on, as explained elsewhere, and the voltage rises on the emitter of transistor Q31. This turns off transistor Q31, breaking the base-emitter junction loop that reverse-biases the output transistors and allowing them to be driven in active mode.

Owing to differences in current gains between the NPN and PNP transistors (and they will never have the same gains when fabricated monolithically), there is a tendency, even under equal collector base voltages, for more base current to flow out of the base of one of the transistors of the complementary pair than the base of the other transistor requires. This excess current would, if not properly resolved, appear as an undesirable leakage current through resistors R23 and R36, onto the output lead, and therefore at the DUT. Such current could interfere with measurements made at the output pin.

To prevent this, a leakage current cancellation circuit is provided. The circuit is formed by transistors Q60, Q58, Q59, Q57, Q56, Q36, and Q55, together with resistors R38, R22, and capacitor C4. Transistors Q58 and Q59 are a complementary pair chosen to simulate Q37 and Q38 respectively. Transistor Q59 is supplied, by Q55 and R38 a current identical to that provided by Q35 and R21 for Q38. Thus, the emitter current in Q59 matches that through Q38. The servo current source Q36 is varied by Q56 so that the base current of Q58 equals and cancels the base current of Q59, and thereby the differential current, between the bases of Q58 and Q59. The current out of Q36 flows through Q58 and Q60 into Q37. Thus, Q37 is provided with the same collector current as flows in Q58. That amount of collector current was established at the level ensuring that the transistor Q58, or one similar, would not oversupply transistor Q59, or one similar, with input base current. With the asymmetrical current gains of the tw transistors thus compensated for, and with the driver circuitry inhibited at both input and output, the output terminal is left connected only to a balanced, unity gain, complementary emitter voltage follower amplifier with high characteristic input impedance.

Having thus described the inventive concept and a specific exemplary embodiment for practice of the invention, it is recognized that various alterations and improvements will readily occur to readers skilled in the art. These alterations and improvements, though not expressly stated, are intended to be suggested by this disclosure. Accordingly, it will be understood that the foregoing description is not intended to be limiting. The invention is limited only as required by the claims which follow and by equivalents thereto.

What is claimed is:

1. In a switching circuit for a bipolar output stage having complementary NPN and PNP transistors selectively operable in a first mode, called the "active" mode, for supplying an output voltage to an output node, and selectively operable in a second mode, called the "inhibit" mode, for providing at the output node an undriven, floating high impedance, the improvement comprising:
   a. means for receiving an INHIBIT command signal, to initiate inhibit mode operation;
   b. means operable in response to signals supplied by the means for receiving, for reverse biasing the base-emitter junctions of the complementary NPN and PNP transistors by only one pn junction voltage relative to the output node; and
   c. buffer means connected to the output node for supplying to the means for reverse biasing a buffered voltage corresponding to the voltage at the output node, and means associated with the buffer means for substantially canceling output leakage currents from the output node to the buffer means in the inhibit mode.

2. The apparatus of claim 1 wherein the buffer means comprises a pair of complementary NPN and PNP transistors having their bases connected together and connected to the output node such that the output node must supply the difference between their base currents, and wherein the means for substantially canceling the output leakage currents causes the base currents of th buffer transistors to be substantially equal.

3. A switching circuit for a bipolar output stage, comprising:
   a. an output node;
   b. a pair of complementary NPN and PNP transistors, each of said transistors having a base and an emitter, each of said emitters operatively connected to the output node;
   c. means for receiving a first reference voltage; and
   d. first selective fixing means operatively connected to the bases of said transistors for selectively fixing the voltage at the output node at the first reference voltage in response to a data signal supplied in a first state, said first selective fixing mean including
      a first node operatively connected to the bases of said transistors which provides a high impedance when the voltage a the output is not substantially equal to the first reference voltage, and
      first current source means operatively connected to the first node for selectively supplying current to the first node.

4. A switching circuit as described in claim 3, further comprising:
   e. means for receiving a second reference voltage; and
   f. second selective fixing means operatively connected to the bases of said transistors for selectively fixing the voltage at the outlet node at the second reference voltage, said second selective fixing means including
      a second node operatively connected to the bases of said transistors which provides high impedance when the voltage at the output is not substantially equal to the second reference voltage, and
      second current source means operatively connected to the second node for selectively supplying current to the second node.

5. A switching circuit as described in claim 4, wherein
   said first node includes a first diode with a first electrode which is operatively connected to said first reference voltage and a second electrode which is operatively connected to the bases of said transistors,
   said fist current source means includes a transistor with a collector which is operatively connected to the first electrode of said first diode,
   said second node includes a second diode with a first electrode which is operatively connected to said second reference voltage and a second electrode which is operatively connected to the bases of said transistors, and
   said second current source means includes a transistor with a collector which is operatively connected to the first electrode of said second diode.

6. The circuit described in claim 4 further comprising:
   g. means selectively operable responsive to an inhibit signal for reverse biasing the base-emitter junction of each of said transistors by controlling the base voltages of said transistors relative to the output node.

7. A bipolar output switching circuit comprising:
   a. an output node;
   b. a pair of complementary NPN and PNP transistors, each of said transistors having a base and an emitter, each of said emitters operatively connected to the output node;
   c. means of receiving first and a second reference voltages;
   . means responsive to an input signal for selectively forward-biasing th base-emitter junctions of said transistor and for selectively controlling the base voltages of said transistors to selectively produce at the output one of said reference voltages; and
   e. means responsive to an inhibit signal or selectively reverse biasing the base-emitter junction of each of said transistors by controlling the base voltages of said transistors relative to the output node.

8. A bipolar output stage selectively operable in a first mode, called the "active" mode, for supplying an output voltage to an output node, and selectively operable in a second mode, called the "inhibit" mode, for providing at the output node an undriven, floating high impedance, comprising:
   a. an output node;
   b. a par of complementary NPN and PNP transistors, each of said transistors having a base and an emitter, each of said emitters operatively connected to the output node;
   c. means for selectively forward biasing said transistors when the circuit is in active mode and for selectively controlling th base voltages of said transistors to produce an output voltage on the output node when the circuit si in active mode;

d. means for selectively reverse-biasing the base-emitter junctions of said transistors when the circuit is in inhibit mode; and e. means, responsive to the voltage at the output node and the voltages on the bases of said transistors, for limiting the reverse-biased base-emitter junction voltages of said transistors.

9. The circuit described in claim 8 wherein said means for limiting limits the reverse-biased base-emitter junction voltages of each of said transistors to only one forward biased pn junction voltage.

10. The circuit described in claim 8 wherein said means for limiting includes a buffer, having an input which is operatively connected to the output node, and having an output, and a first diode and a second diode, said first diode having a cathode which is operatively connected to the output of the buffer, said second diode having an anode which is operatively connected to the output of the buffer, said first diode having an anode which is operatively connected to the base of said NPN transistor, and said second diode having a cathode which is operatively connected to the base of said PNP transistor.

11. A bipolar output switching circuit with a buffer for sensing the output and means for limiting leakage current comprising:

a. an output node;

b. a pair of complementary NPN and PNP transistors, each of said transistors having a base and an emitter, each of said emitters operatively connected to the output node;

c. a buffer for sensing the voltage at the output node, said buffere including a pair of complementary NPN and PNP transistor each having a base which is operatively connected to the output node, an emitter, and a collector;

d. means for making the base currents of the buffere NPN and PNP transistors substantially equal, including 1. a first simulating transistors, having a base, an emitter and a collector, provided in correspondence with the buffere NPN transistor, 2. a second simulating transistor, having a base, and emitter and a collector, provided in correspondence with the buffer PNP transistor, 3. means for making the base currents of the first simulating transistor and the second simulating transistor substantially equal, 4. means for making the emitter currents of the buffere NPN transistor and the first simulating transistor substantially equal, 5. means for making the emitter currents of the buffere PNP transistor and the second simulating transistor substantially equal, 6. first matching means or making the collector-base voltages of the first simulating transistor and the buffere NPN transistor substantially equal, and 7. second matching means for making the collector-base voltages of the second simulating transistor and the buffer PNP transistor substantially equal.

12. The circuit described in claim 11 wherein said first matching means fixes collector-base voltages of 0 on the first simulating transistor and the buffer NPN transistor, and said second matching means fixed collector-base voltages of 0 on the second simulating transistor and the buffer PNP transistor.

13. A bipolar output switching circuit with a buffer for sensing the output and means for limiting leakage current comprising:

a. an output node;

b. a pair of complementary NPN and PNP transistors, each of said transistors having base and an emitter, each of said emitters operatively connected to the output node;

c. a buffere for sensing the voltage at the output node, said buffer including a first and a second transistor each having a base which is imperatively connected to the output node, an emitter, and a collector;

d. means for making the base currents of the first and second transistors substantially equal, including 1. a first simulating transistor, having a base, one emitter, and a collector, provided in correspondence with the first transistor, 2. a second simulating transistor, having a base, an emitter, and a collector, provided in correspondence with the second transistor, 3. means for establishing an emitter current in said first simulating transistor identical to the emitter current in said first transistor, 4. means for establishing a base current in said second simulating transistor identical to the base current in said first simulating transistor, and 5. means for establishing an emitter current in said second transistor identical to the emitter current in said second simulating transistor.

14. The circuit described in claim 13, said means for making base current substantially equal further including 6. means for making the collector-base voltages of the first simulating transistor and the first transistor substantially equal, and 7. means or making the collector-base voltages of the second simulating transistor and the second transistor substantially equal.

* * * * *